(12) United States Patent
Choi et al.

(10) Patent No.: US 9,449,809 B2
(45) Date of Patent: Sep. 20, 2016

(54) INTERFACE ADHESION IMPROVEMENT METHOD

(71) Applicants: Young Jin Choi, Santa Clara, CA (US); Jrjyan Jerry Chen, Campbell, CA (US); Beom Soo Park, San Jose, CA (US); Soo Young Choi, Fremont, CA (US)

(72) Inventors: Young Jin Choi, Santa Clara, CA (US); Jrjyan Jerry Chen, Campbell, CA (US); Beom Soo Park, San Jose, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 269 days.

(21) Appl. No.: 13/947,032

(22) Filed: Jul. 20, 2013

(65) Prior Publication Data

US 2014/0024180 A1 Jan. 23, 2014

Related U.S. Application Data

(60) Provisional application No. 61/674,028, filed on Jul. 20, 2012.

(51) Int. Cl.
| | |
|---|---|
| *H01L 21/02* | (2006.01) |
| *C23C 16/30* | (2006.01) |
| *H01L 51/00* | (2006.01) |
| *H01L 51/52* | (2006.01) |

(52) U.S. Cl.
CPC ....... *H01L 21/02107* (2013.01); *C23C 16/308* (2013.01); *H01L 51/0096* (2013.01); *H01L 51/5253* (2013.01); *Y02E 10/549* (2013.01)

(58) Field of Classification Search
CPC ....... C23C 16/34; C23C 16/308; B05D 5/06; H01L 21/02107
See application file for complete search history.

(56) References Cited

U.S. PATENT DOCUMENTS

| | | | | |
|---|---|---|---|---|
| 5,883,004 A | * | 3/1999 | Shiu et al. | ..... 438/692 |
| 6,667,072 B2 | * | 12/2003 | Shuy et al. | ..... 427/58 |
| 7,302,309 B2 | | 11/2007 | Scott et al. | |

(Continued)

FOREIGN PATENT DOCUMENTS

| | | |
|---|---|---|
| KP | 10-2010-0064870 | 6/2010 |
| KP | 10-2010-0090887 | 8/2010 |
| KR | 101560234 B1 | 10/2015 |

OTHER PUBLICATIONS

Shih, Wu-Sheng, et al., "Planarization Process for Transparent Polyimide Coatings to Reduce Topography and Overburden Variation". CS MANTECH Conference, May 14-17, 2007, Austin, Texas, USA, pp. 195-198.*

(Continued)

*Primary Examiner* — Bret Chen
(74) *Attorney, Agent, or Firm* — Patterson & Sheridan, LLP

(57) ABSTRACT

The present disclosure describes methods of an interface adhesion improvement methods used on a transparent substrate for OLED or thin film transistor applications. In one embodiment, a method of forming a buffer layer on a surface of a substrate includes providing a substrate having an planarization material disposed thereon in a processing chamber, supplying a buffer layer gas mixture including a silicon containing gas into the processing chamber, controlling a substrate temperature less than about 100 degrees Celsius, forming a buffer layer on the planarization material, supplying an encapsulating barrier layer deposition gas mixture including a silicon containing gas and a nitrogen containing gas into the processing chamber, and forming an encapsulating barrier layer on the buffer layer.

22 Claims, 5 Drawing Sheets

(56) References Cited

U.S. PATENT DOCUMENTS

| | | | |
|---|---|---|---|
| 7,387,537 | B1 | 6/2008 | Daily et al. |
| 7,387,557 | B2 | 6/2008 | Kang et al. |
| 7,495,252 | B2 | 2/2009 | Ahn et al. |
| 7,521,857 | B2 | 4/2009 | Kang et al. |
| 7,549,905 | B2 | 6/2009 | Lee et al. |
| 7,919,396 | B2 | 4/2011 | Ahn et al. |
| 2003/0098647 | A1* | 5/2003 | Silvernail ........... H01L 51/5237 313/506 |
| 2004/0251627 | A1 | 12/2004 | Kang et al. |
| 2005/0212419 | A1 | 9/2005 | Vazan et al. |
| 2005/0287688 | A1* | 12/2005 | Won et al. ....................... 438/22 |
| 2006/0061272 | A1* | 3/2006 | McCormick ........ H01L 51/5253 313/512 |
| 2006/0246811 | A1* | 11/2006 | Winters .............. H01L 51/5237 445/25 |
| 2007/0105473 | A1 | 5/2007 | Lee et al. |
| 2008/0111494 | A1* | 5/2008 | Kim .......................... 315/169.3 |
| 2008/0136320 | A1* | 6/2008 | Choi ............................. 313/504 |
| 2009/0162949 | A1* | 6/2009 | Takagi et al. ..................... 438/4 |
| 2009/0224662 | A1* | 9/2009 | Wu ............................... 313/504 |
| 2011/0049730 | A1* | 3/2011 | Schmid et al. ................ 257/787 |
| 2011/0140163 | A1* | 6/2011 | Oh et al. ....................... 257/100 |
| 2011/0171584 | A1 | 7/2011 | Suh et al. |

OTHER PUBLICATIONS

Li, Peng, et al., "Development of spin-on-glass process for triple metal interconnects". Journal of Semiconductors, vol. 31, No. 12, Dec. 2010, 126003, pp. 1-3.*

Akedo "Fabrication of OLEDs on Epoxy Substrates with SiNx/CNx:H Multi-layer Barrier Films" IDW '04, pp. 1367-1370, 2004.

Akedo, "LP-5: Late-News Poster: Plasma-CVD SiNx / Plasma-Polymerized CNx: H Multi-Layer Passivation Films for Organic Light-Emitting Diodes" SID 03 Digest, pp. 559-561, May 2003.

Nisato, "Thin Film Encapsulation for OLEDs: Evaluation of Multi-layer Barriers using the Ca Test", SID 03 Digest, pp. 559-561, May 2003.

Han-Ki Kim, Sang-Woo Kim, Do-Geun Kim, Jae-Wook Kang, Myung Soo Kim, and Woon Jo Cho, Thin Solid Films 515(2007)4758.

Anna Maria Coclite and Karen K. Gleason. J. Appl. Phys. 111(2012)073516.

Jian-Shian Lin, Ming-Hua Chung, Chen-Ming Chen, Fuh-Shyang Juang, and Lung-Chang Liu, J. Phys. Org. Chem. 24(2011)193.

H.-H. You, Rev. Sci. Instrum. 84(2013)073513.

Kazufumi Azuma, Satoko Ueno, and Yoshiyuki, Thin Solid Films 580(2015)116.

FJH Van Assche, RT Vangheluwe, JWC Maes, WS Mischke, MD Bijker, and FC Dings, SID Dig 2004, 35:695-7.

H Lifka, HA van Esch, and JJWM Rosink, SID Dig 2004; 35:1384-7.

JJWM Rosink, H Lifka, GH Rietjens, and A Pierik, SID Dig 2005: 36:1272-5.

Renzheng Sang, Hao Zhang, Li Long, Zikai Hua, Jianling Yu,, Bin Wei, , Xingyang Wu, Tao Feng, and, Jianhua zhang, International Conference on Electronic Packaging Technology & High Density Packaging, p. 1175 (2011).

E.N. Ermakova, S.V. Sysoev, L.D. Nikulina, I.P. Tsyrendorzhieva, V.I. Rakhlin, and M.L. Kosinova, Thermochimica Acta (2015) in press.

A Yoshida, S Fujimura, T Miyake, T Yoshizawa, H Ochi, and A Sugimoto, SID Dig 2003: 34:856-9.

H. Yasuda, "Plasma Polymerization", Academic Press Inc., Orlando (1985).

N. De Geyter, R. Morent, S. Van Vlierberghe, P. Dubruel, C. Leys, and E. Schacht, Surface Engineering vol. 27, No. 8 (2011)627.

Fulvia Villani, Paolo Vacca, Giuseppe Nenna, Olga Valentino, Gianbattista Burrasca, Tommaso Fasolino, Carla Minarini and Dario della Sala, J. Phys. Chem. C, 2009, 113 (30), pp. 13398-13402.

Marcel Hemerik, Rob Van Erven, Rik Vangheluwe, james Yang, Tom Van Rijswujk, Rogier Winters, and Bas Van Rens, SID Symp. Digest Vlo. 37, Issue 1 (2006)1571.

D. Hegemann, U. Vohrer, C. Oehr, and R. Riedel, Surface and Coating Technology 116-119(1999)1033-1036.

Mirjam Theeien, David Habets, Lutz Staemmler, Hans Winands, and Pieter Bolt, Surface and Coating Technology 211(2012)9-13.

Jrjyan Jerry Chan, "Thin Film Encapsulation by PECVD", Applied Materials.

Prashant Mandlik, Jonathan Gartside, Lin Han, I-Chun Cheung, Sigurd Wagner, Jeff A. Silvernail, Rui-Qing Ma, Michael Hack, and Julie J. Brown, Appl. Phys. Lett. 92(2008)103309.

Yun-Shiuan Li, Chih-Hung Tsai, Shao-Hsuan Kao, I-Wen Wu, Jian-Zhang Chen, Chih-I Wu, Ching-Fuh Lin, and I-Chun Cheng, Physics D: Applied Physics vol. 46, No. 43, 435502(2013).

Tae Won Kim, Min Yan, Ahmet Gun Erlat, paul A. McConnelee, Mathew Pellow, John Deluca, Thomas P. Feist, Anil R. Duggal, and Marc Schaepkens, J. Vac. Sci. Technol. A 23(2005)971.

A. P. Ghosh, L. J. Gerenser, C. M. Jarnan, and J. E. Fomalik, Appl. Phys. Lett. 86(2005)223503.

Seung-Woo Seo, Heeyeop Chae, Sang Joon Seo, Ho Kyoon Chung, and Sung Min Cho, Appl. Phys. Lett. 102(2013)161908.

P. F. Carcia, R. S. McLean, M. D. Groner, A. A. Dameron, and S. M. George, J. Appl. Phys. 106(2009)023533.

F. L. Wang, M. K. Fung, S. K. Tao, S. L. Lai, W. M. Tsang, K. H. Kong, W. M. Choy, C. S. Lee, and T. S. Lee, J. Appl. Phys. 104(2008)014509.

* cited by examiner

INTERFACE ADHESION IMPROVEMENT METHOD

CROSS-REFERENCE TO RELATED APPLICATIONS

This application claims benefit of U.S. Provisional Application Ser. No. 61/674,028 filed Jul. 20, 2012, which is incorporated by reference in their entirety.

BACKGROUND OF THE INVENTION

1. Field of the Invention

Embodiments of the present invention generally relate to methods for improving interface adhesion. More particularly, embodiments of the present invention relate to interface adhesion improvement methods performed on a surface of a substrate used in thin-film transistor or OLED applications.

2. Description of the Related Art

Organic light emitting diode (OLED) displays have gained significant interest recently in display applications in view of their faster response times, larger viewing angles, higher contrast, lighter weight, lower power and amenability to flexible substrates. Generally, a conventional OLED is enabled by using one or more layers of organic materials sandwiched between two electrodes for emitting light. The one or more layers of organic materials include one layer capable of monopolar (hole) transport and another layer for electroluminescence and thus lower the required operating voltage for OLED display.

In addition to organic materials used in OLED, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel display (FPD), electrically pumped organic laser, and organic optical amplifier.

Over the years, layers in display devices have evolved into multiple layers with each layer serving different function. FIG. 1 depicts an example of an OLED device structure 100 built on a substrate 102. The OLED device structure 100 includes an anode layer 104 deposited on the substrate 102. The substrate 102 may be made of glass or plastic, such as polyethyleneterephthalate (PET) or polyethyleneterephthalate (PEN). An example of the anode layer 104 is an indium-tin-oxide (ITO).

Multiple layers of organic or polymer materials 106 may be deposited on the anode layer 104. Multiple layers of organic or polymer materials 106 may generally include a hole-transport layer and an emissive layer. Different organic materials may be used to fabricate the hole-transport layer and the emissive layer. Suitable examples of the hole-transport layer may be fabricated from diamine, such as a naphthyl-substituted benzidine (NPB) derivative, or N,N'-diphenyl-N,N'-bis(3-methylphenyl)-(1,1'-biphenyl)-4,4'-diamine (TPD). Additionally, suitable examples of the emissive layer may be fabricated from 8-hydroxyquinoline aluminum ($Alq_3$). Subsequently, an electrode layer 108 or called cathode layer may be formed on the organic or polymer materials 106 to complete the device structure 100. The electrode layer 108 can be a metal, a mixture of metals or an alloy of metals. An example of the top electrode material is an alloy of magnesium (Mg), silver (Ag) and aluminum (Al) in the thickness range of about 1000 Å to about 3000 Å. The structure of the organic or polymer materials 106 and the choice of anode and cathode layers 104, 108 are designed to maximize the recombination process in the emissive layer, thus maximizing the light output from the OLED devices.

After the device structure 100 is formed on the substrate 102, a first barrier layer 111 followed by an encapsulating planarization layer 110 formed thereon. Subsequently, a second encapsulating barrier layer 112 is formed thereon. Additional passivation layers 116, 118 may be formed on the encapsulating barrier layer 112 as needed to provide sealing of the device structure 100 from moisture or air exposure. However, different materials, especially organic and inorganic materials, often have different film properties, thereby resulting in poor surface adhesion at the interface where the organic and the inorganic layers are in contact with. For example, poor adhesion is often present at an interface 114 formed between the first encapsulating planarization layer 110 and the second encapsulating barrier layer 112 (or the interface between the first encapsulating barrier layer 111 and the first encapsulating planarization layer 110). Poor interface adhesion often allows film peeling or particle generation, thereby adversely contaminating the device structure 100 and eventually leading to device failure. Additionally, poor adhesion at the interface 114 may also increase the likelihood of film cracking, thereby allowing the moisture or air to sneak into the device structure 100, thereby deteriorating the device electrical performance.

Thus, there is a need for methods to form an interface with different materials with good adhesion while maintaining good passivation capability to prevent device structure from moisture.

SUMMARY OF THE INVENTION

Embodiments of the invention provide interface adhesion improvement methods used on a transparent substrate for OLED or thin film transistor applications. In one embodiment, a method of forming a buffer layer on a surface of a substrate includes providing a substrate having a planarization material disposed thereon in a processing chamber, supplying a buffer layer gas mixture including a silicon containing gas into the processing chamber, controlling a substrate temperature less than about 100 degrees Celsius, forming a buffer layer on the planarization material, supplying an encapsulating barrier layer deposition gas mixture including a silicon containing gas and a nitrogen containing gas into the processing chamber, and forming an encapsulating barrier layer on the buffer layer.

In another embodiment, a method of performing a surface treatment process includes providing a substrate having a planarization material disposed thereon in a processing chamber, supplying a gas mixture including a nitrogen containing gas into the processing chamber, and performing a surface treatment process using the gas mixture on the surface of the planarization material.

In yet another embodiment, a method of performing a surface treatment process includes providing a substrate having an encapsulating barrier layer disposed thereon in a processing chamber, supplying a gas mixture including $NH_3$ gas and $N_2$ gas into the processing chamber, performing a surface treatment process using the gas mixture on the surface of the encapsulating barrier layer, and forming a planarization material on the treated encapsulating barrier layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention include methods for improving surface adhesion at an interface with different materials for improving surface adhesion for the encapsulating layers passivating a device structure. In some embodiments, the invention may be advantageously used in OLED applications or thin film transistor applications. In one embodiment, the interface adhesion is improved by forming a buffer layer between film layers of different materials or of different film properties. The buffer layer may be a silicon containing or nitrogen containing dielectric layer. In another embodiment, the interface adhesion is improved by performing a plasma treatment process at the interface between film layers of different materials or of different film properties. As the plasma treatment process alters at least some of surface properties, e.g., wetability or surface roughness, atoms from the subsequent deposited layer to be adhered more securely on the interface as compared to conventional deposition techniques. In still another embodiment, an encapsulating layer with multiple film layers may be utilized to passivate the device structures to promote interface adhesion as well as moisture resistance.

Figure 2:
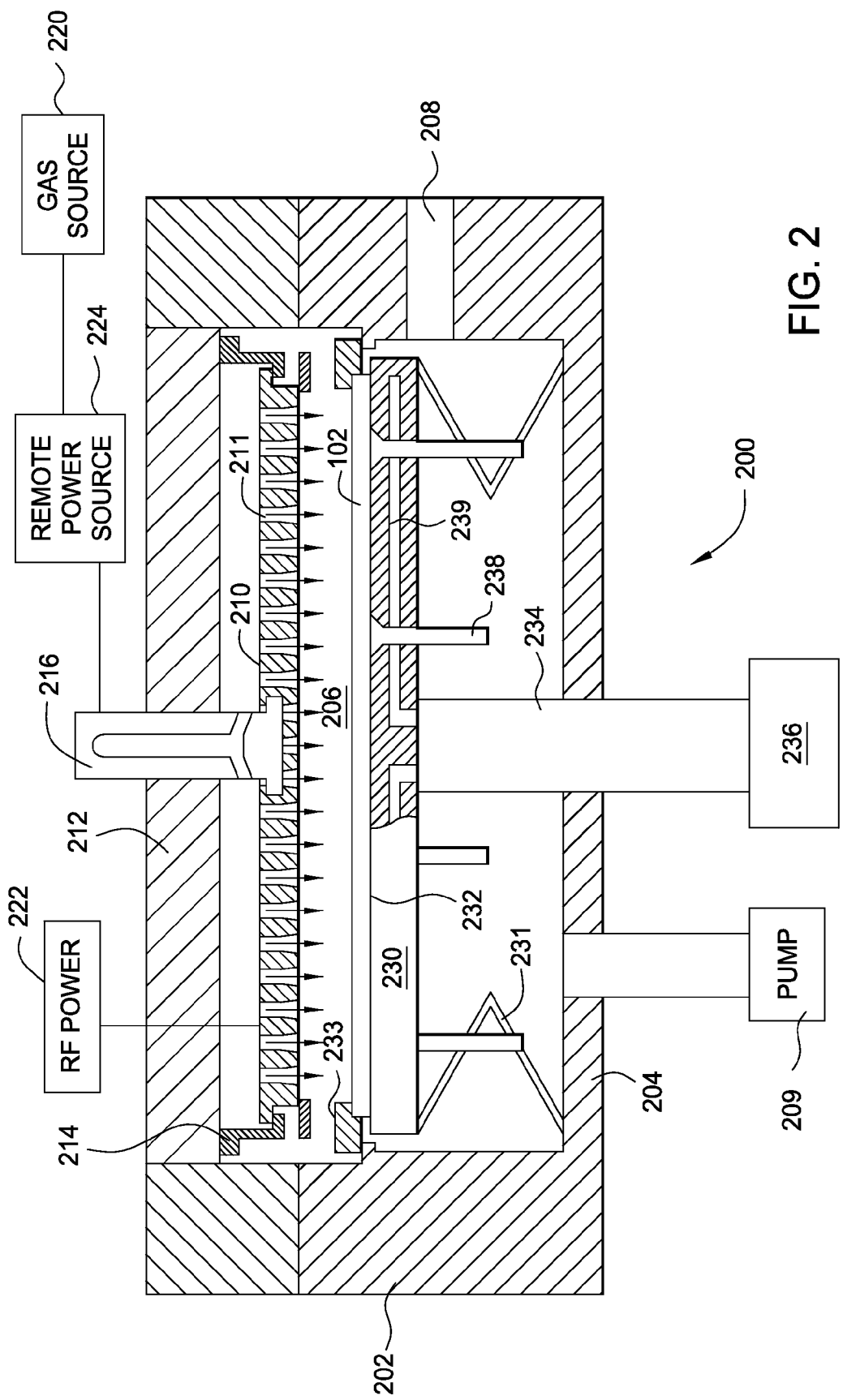
FIG. 2 depicts a cross-sectional view of an apparatus suitable for depositing a buffer layer according to one embodiment of the invention.

FIG. 2 is a schematic cross-section view of one embodiment of a plasma enhanced chemical vapor deposition (PECVD) chamber 200 in which a surface treatment process and/or a buffer layer deposition process may be performed therein. It is noted that FIG. 2 is just an exemplary apparatus that may be used to perform the surface treatment process and/or a buffer layer deposition process on a substrate. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 200 generally includes walls 202, a bottom 204, and a showerhead 210, and substrate support 230 which define a process volume 206. The process volume 206 is accessed through a sealable slit valve 208 formed through the walls 202 such that the substrate, may be transferred in and out of the chamber 200. The substrate support 230 includes a substrate receiving surface 232 for supporting a substrate 102 and stem 234 coupled to a lift system 236 to raise and lower the substrate support 230. A shadow ring 233 may be optionally placed over periphery of the substrate 102. Lift pins 238 are moveably disposed through the substrate support 230 to move the substrate 102 to and from the substrate receiving surface 232. The substrate support 230 may also include heating and/or cooling elements 239 to maintain the substrate support 230 and substrate 102 positioned thereon at a desired temperature. The substrate support 230 may also include grounding straps 231 to provide RF grounding at the periphery of the substrate support 230.

The showerhead 210 is coupled to a backing plate 212 at its periphery by a suspension 214. The showerhead 210 may also be coupled to the backing plate 212 by one or more center supports 216 to help prevent sag and/or control the straightness/curvature of the showerhead 210. A gas source 220 is coupled to the backing plate 212 to provide gas through the backing plate 212 and the showerhead 210 to the substrate receiving surface 232. A vacuum pump 209 is coupled to the chamber 200 to control the pressure within the process volume 206. An RF power source 222 is coupled to the backing plate 212 and/or to the showerhead 210 to provide RF power to the showerhead 210 to generate an electric field between the showerhead 210 and the substrate support 230 so that a plasma may be formed from the gases present between the showerhead 210 and the substrate support 230. Various RF frequencies may be used, such as a frequency between about 0.3 MHz and about 200 MHz. In one embodiment, the RF power source 222 provides power to the showerhead 210 at a frequency of 13.56 MHz.

A remote plasma source 224, such as an inductively coupled remote plasma source, may also be coupled between the gas source 226 and the backing plate 212. Between processing substrates, a cleaning gas may be provided to the remote plasma source 224 and excited to form a remote plasma from which dissociated cleaning gas species are generated and provided to clean chamber components. The cleaning gas may be further excited by the RF power source 222 provided to the showerhead 210 to reduce recombination of the dissociated cleaning gas species. Suitable cleaning gases include but are not limited to $NF_3$, $F_2$, and $SF_6$.

In one embodiment, the heating and/or cooling elements 239 may be utilized to maintain the temperature of the substrate support 230 and substrate 102 thereon during deposition less than about 400° C. or less. In one embodiment, the heating and/or cooling elements 239 may used to control the substrate temperature less than 100 degrees Celsius, such as between 20 degree Celsius and about 90 degrees Celsius.

The spacing during deposition between a top surface of the substrate 102 disposed on the substrate receiving surface 232 and the showerhead 210 may be between 400 mil and about 1,200 mil, for example between 400 mil and about 800 mil.

Figure 3:
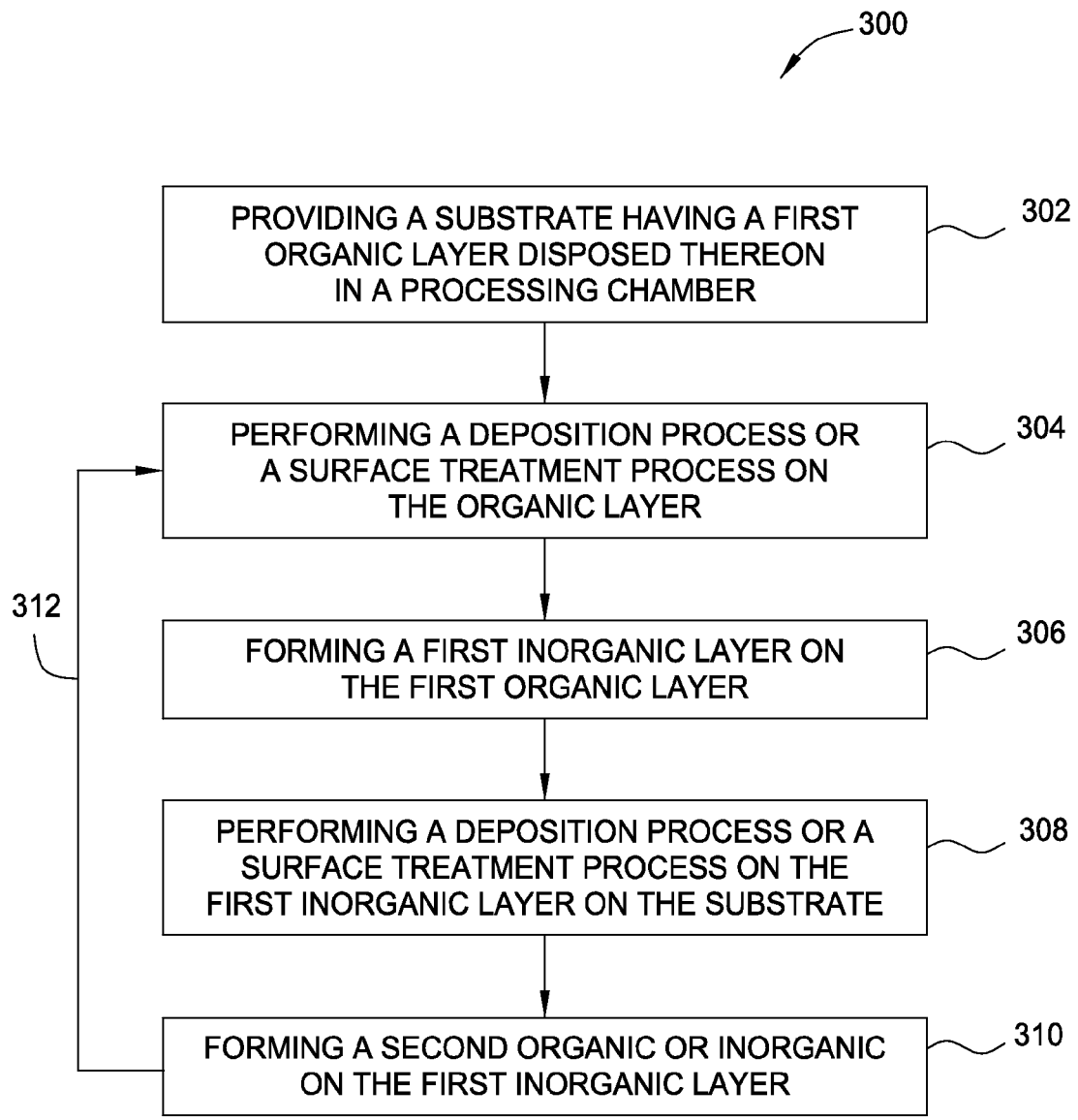
FIG. 3 depicts a process flow diagram for performing an interface adhesion enhancement process on a substrate in accordance with one embodiment of the present invention.

FIG. 3 is a flow diagram of one embodiment of an interface adhesion enhancement process 300 performed on a surface of a substrate. The process 300 may be performed in a processing chamber, such as the processing chamber 200 depicted in FIG. 2 or other suitable chamber. FIGS. 4A-4E depict a sequence of fabrication stages of performing the interface adhesion enhancement process on a substrate according to the process 300 depicted in FIG. 3. The following description of the process 300 is made with simultaneous references to FIGS. 3-4E.

Figure 1:
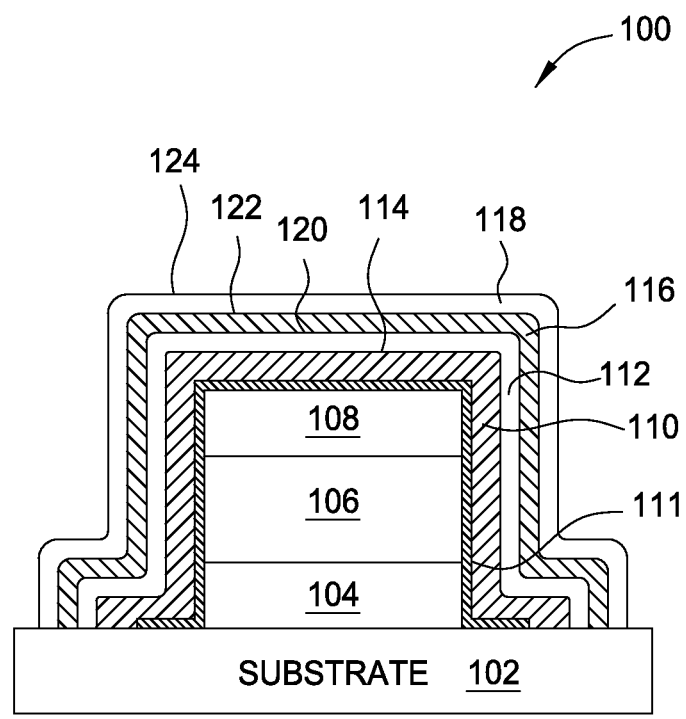
FIG. 1 depicts a schematic side view of a OLED structure.
Figure 4A:
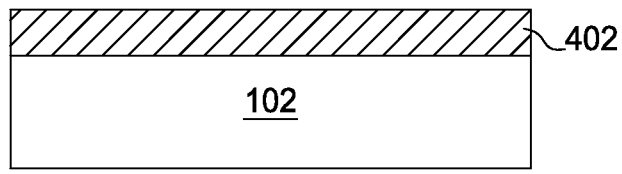
FIGS. 4A-4E depict a sequence of fabrication stages of the interface adhesion enhancement process in accordance with one embodiment of the present invention.
Figure 4B:
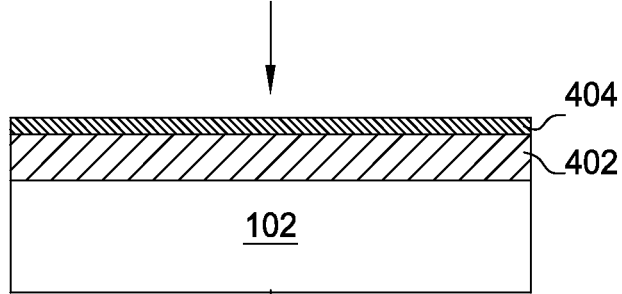

The process 300 begins at step 302 by transferring (i.e., providing) the substrate 102, as shown in FIG. 4A, to a processing chamber, such as the processing chamber 200 depicted in FIG. 2 or other suitable chamber. In the embodiment depicted in FIG. 4A, the substrate 102 may be thin sheet of metal, plastic, organic materials, glass, quartz, or polymer, or other suitable material. In one embodiment, the substrate 102 may have a top surface area greater than about 1 square meters, such as greater than about 6 square meters. The substrate 102 may be configured to form OLED or thin film transistor devices, or other types of display applications as needed. In another embodiment, the substrate 102 may be configured to have OLED or thin film transistor devices, or other types of display applications having a barrier layer formed thereon as needed In one embodiment, the substrate 102 may include OLED device structure, such as the OLED device structure 100 depicted in FIG. 1, disposed thereon. Above the OLED device structure 100, a first encapsulating barrier layer, similar to the first encapsulating barrier layer 111 depicted in FIG. 1, maybe be deposited on the OLED device structure 100 as needed for OLED device structure protection. In one example, the first encapsulating barrier layer may be a silicon containing layer, such as silicon oxide, silicon nitride, silicon oxynitride, or combinations thereof. A first planarization layer 402 may be disposed on the substrate 102. The first planarization material 402 may be similar to the encapsulating material 110 depicted in FIG. 1, that assists stress relief, particle conformality, and flexibility to the film structures where the first planarization material 402 is formed on. In one embodiment, the first planarization material 402 may assist to release stress or planarize the surface of the structures formed on the substrate 102. In one embodiment, the first planarization material 402 may be a polymer material, or a polymer-like material. In the embodiment wherein the first planarization material 402 is a polymer material, the polymer material may be composed by hydrocarbon compounds generally having a formula $C_xH_yO_z$, wherein x, y and z are integers. In one particular embodiment, suitable materials for the polymer material may be selected from a group consisting of polyacrylate, parylene, polyimides, polytetrafluoroethylene, copolymer of fluorinated ethylene propylene, perfluoroalkoxy copolymer resin, copolymer of ethylene and tetrafluoroethylene, parylene or other suitable polymeric materials. In one embodiment, the first planarization material 402 is polyacrylate or parylene.

In the embodiment, wherein the first planarization material 402 is a polymer-like material having film properties including both organic and inorganic states, suitable examples of the polymer-like material may include plasma-polymerized hexamethyldisiloxane (pp-HMDSO), hexamethyldisiloxane (HMDSO), fluorine doped hexamethyldisiloxane (HMDSO:F), or other silicon/carbon containing SiO composite. Deposition of the pp-HMDSO material layer is achieved by flowing an oxygen-containing gas and HMDSO gas. During deposition of the pp-HMDSO layer, the ratio of the flow of oxygen-containing gas to the flow of HMDSO gas is controlled to control the organic/inorganic state and properties of the resulting pp-HMDSO layer.

At step 304, a deposition process or a surface plasma treatment is performed on the first planarization material 402 to form a buffer layer 404 or a treated layer 404 on the first planarization material 402. In the embodiment wherein a deposition process is utilized, the deposition process as performed may deposit the buffer layer 404 on the first planarization material 402. In one example, the buffer layer 404 may be a silicon containing layer. It is believed that the silicon elements from the buffer layer 404 may bridge with the silicon, oxygen, or carbon elements formed in the first planarization material 402 so as to form strong bonding at the interface, thus efficiently improving the interface adhesion. In one embodiment, the buffer layer 404 may be a $SiO_2$, SiON, or $SiO_xN_y$, wherein x and y are integers.

In another embodiment, the buffer layer 404 may be a silicon and oxygen containing dielectric layer disposed on the first planarization material 402. The silicon and oxygen elements formed in the buffer layer 404 not only have silicon elements to form strong bonding with the underlying first planarization material 402, but also include elements (e.g., oxygen elements), similar to the elements formed in the first planarization material 402, formed therein, so as to provide similar film properties (e.g. compatible film characteristics) at the interface to improve surface adhesion and eliminate likelihood of film peeling that may be caused from poor adhesion and/or incompatible film properties. In one embodiment, the buffer layer 404 may be $SiO_2$, SiON or $SiO_xN_y$, wherein x and y are integers.

In yet another embodiment, the buffer layer 404 may be a silicon, oxygen and nitrogen containing layer disposed on the first planarization material 402. The silicon, oxygen and nitrogen containing layer may additionally include nitrogen elements disposed therein (e.g., along with the silicon and oxygen elements having the benefits as discussed above providing good adhesion to the underlying first planarization material 402). The nitrogen elements as formed in the silicon, oxygen and nitrogen containing layer in the buffer layer 404 may efficiently bridge with a barrier layer (such as the encapsulating barrier layer 406 discussed below with referenced to FIGS. 4C-4E) subsequently formed on the buffer layer 404, thereby providing a good surface adhesion at the both interfaces below and above the buffer layer 404. In one embodiment, the buffer layer 404 deposited on the first planarization material 402 is a silicon oxynitride (SiON) layer.

Figure 5:
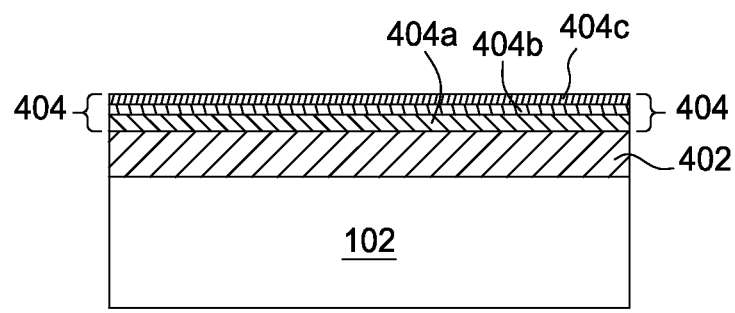
FIG. 5 depicts another embodiment of an film structure formed on a substrate in accordance with another embodiment of the present invention.

In still another embodiment, the buffer layer 404 may be in form of multiple layers with more than one type of layers, organic layers or inorganic layers, disposed on the first planarization material 402. In one example, the buffer layer 404 may include three layers 404a, 404b, 404c, as further depicted in FIG. 5. The first layer 404a in contact with the first planarization material 402 is a silicon, oxygen and nitrogen containing layer, such as a silicon oxynitride (SiON) layer. It is believed that the silicon and oxygen elements contained in the silicon oxynitride (SiON) layer may assist adhering the first layer 404a onto the first planarization material 402 with good adhesion. Subsequently, a second layer 404b, such as a silicon and nitrogen containing layer (e.g., a SiN layer) is formed on the first layer 404a, and followed by a third layer 404c, also a silicon, oxygen and nitrogen containing layer, such as a silicon oxynitride (SiON) layer, disposed on the second layer 404b. The second layer 404b of SiN layer sandwiched between the first and the third layer 404a, 404c is believed to assist the passivation properties of the buffer layer 404 so as to prevent moisture from sneaking into the substrate 102 where the devices are formed on. In this particular embodiment, the first layer 404a may have a thickness between about 100 Å and about 5000 Å, such as about 3000 Å. The second layer 404b may have a thickness between about 2500 Å and about 5000 Å, such as about 4000 Å. The third layer 404c may have a thickness between about 500 Å and about 5000 Å, such as about 3000 Å.

The buffer layer deposition process may be performed by supplying a gas mixture into the processing chamber. In one example, the gas mixture may include at least a silicon containing gas when a silicon containing layer is formed as the buffer layer 404 on the first planarization material 402. In another example, the gas mixture may include at least one silicon containing gas and an oxygen containing gas when a silicon and oxygen containing layer is formed as the buffer layer 404 on the first planarization material 402. In yet another example, the gas mixture may include at least one silicon containing gas, an oxygen containing gas and/or a nitrogen containing gas when a silicon, oxygen and nitrogen containing layer is formed as the buffer layer 404 on the first planarization material 402. Suitable examples of the silicon containing gas include $SiH_4$, $Si_2H_6$, $SiCl_4$ and the like. Suitable examples of the oxygen containing gas include $O_2$, $N_2O$, $NO_2$, $O_3$, $H_2O$, $CO_2$, CO, combinations thereof and the like. Suitable examples of the nitrogen containing gas include $N_2$, $NH_3$, $N_2O$, $NO_2$, combinations thereof and the like. Furthermore, other suitable carrier gas including inert gas (e.g., Ar, He, Ne, Kr or the like) or $H_2$ or $N_2$ gas may also supply in the gas mixture as needed.

Figure 4C:
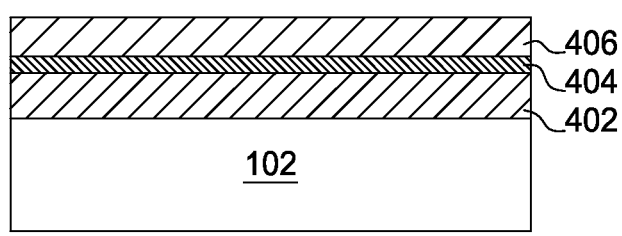

In one particular embodiment, the buffer layer 404 disposed on the first planarization material 402 is a silicon oxynitride layer (SiON). The gas mixture supplied to deposit the silicon oxynitride layer (SiON) includes $SiH_4$, $N_2$, $NO_2$ or $N_2O$ and $NH_3$. In another example, the gas mixture may include $SiH_4$, $H_2$, and $NO_2/N_2O/NH_3$ to deposit the silicon oxynitride layer (SiON). It is believed that hydrogen elements generated in the gas mixture may efficiently react with the unsaturated carbon bonds in the first planarization material 402, turning the unsaturated carbon bonds into saturated carbon bonds interfacing with the buffer layer 404, creating a surface with strong bonding and adhesion. Furthermore, as discussed above, the silicon elements and/or oxygen elements may also efficiently react with the oxygen elements in the first planarization material 402 to improve surface adhesion. The nitrogen elements formed in the buffer layer 404 may also later provide a good interface property to the encapsulating barrier layer 406 subsequently formed thereon as depicted in FIG. 4C performed at step 306.

In the particular embodiment wherein $SiH_4$, $N_2$, $N_2O$ and $NH_3$ are supplied in the gas mixture for depositing the SiON layer, the $SiH_4$ gas supplied in the gas mixture is controlled at between about 2.5 sccm/L and about 15 sccm/L. $N_2$ gas is supplied to the gas mixture between about 15 sccm/L and about 66 sccm/L. $N_2O$ gas supplied in the gas mixture is controlled at between about 3 sccm/L and about 22 sccm/L. $NH_3$ gas is supplied to the gas mixture between about 3 sccm/L and about 40 sccm/L. The $N_2$ gas and $NH_3$ gas supplied in the gas mixture may be controlled at a flow ratio from about 1:1 to about 1:10, such as between about 1:2 and about 1:5, for example between about 1:1.5 and about 1:3.

In the particular embodiment wherein $SiH_4$, $N_2O$ and $H_2$ are supplied in the gas mixture for depositing the SiON layer, the $SiH_4$ gas supplied in the gas mixture is controlled at between about 2.5 sccm/L and about 15 sccm/L. $H_2$ gas is supplied to the gas mixture between about 5 sccm/L and about 80 sccm/L. $N_2O$ gas supplied in the gas mixture is controlled at between about 3 sccm/L and about 22 sccm/L. The $H_2$ gas and $N_2O$ gas supplied in the gas mixture may be controlled at a flow ratio from about 2:1 to about 10:1.

In the particular embodiment wherein $SiH_4$, $N_2$, and $NH_3$ are supplied in the gas mixture for depositing the SiN layer, the $SiH_4$ gas supplied in the gas mixture is controlled at between about 2.5 sccm/L and about 15 sccm/L. $N_2$ gas is supplied to the gas mixture between about 15 sccm/L and about 66 sccm/L. $N_2O$ gas supplied in the gas mixture is controlled at between about 3 sccm/L and about 22 sccm/L. $NH_3$ gas is supplied to the gas mixture between about 3 sccm/L and about 40 sccm/L. The $N_2$ gas and $NH_3$ gas supplied in the gas mixture may be controlled at a flow ratio from about 1:1 to about 1:10, such as between about 1:2 and about 1:5, for example between about 1:1.5 and about 1:3.

Several process parameters may be controlled while performing the buffer layer deposition process. A RF power supplied to do the deposition process may be controlled at between about 0 milliWatts/cm$^2$ and about 1500 milliWatts/cm$^2$, such as about 1000 milliWatts/cm$^2$, may be provided to the 600 milliWatts/cm$^2$ for deposition process. The RF power is controlled at a high range greater than 500 milliWatts/cm$^2$. It is believed that the high RF power utilized during the deposition process may form the buffer layer with high film stress, e.g., a compressive film, so as to reduce likelihood of peeling or particular generation. The substrate temperature may be controlled less than 100 degrees Celsius. As the substrate 102 includes polymer or polymer-like materials disposed thereon, a low temperature deposition process, such as less than 100 degrees Celsius, is utilized so as to deposit the buffer layer 404 with desired properties while maintaining the film properties of the polymer or polymer-like layers formed on the substrate 102. In one embodiment, the substrate temperature is controlled at between about 70 degrees Celsius and about 90 degrees Celsius. The spacing may be controlled between about 800 mils and about 1000 mils. The process pressure may be controlled at between about 1 Torr and about 2 Torr. The process time may be controlled at a range when a desired thickness of the buffer layer 404 is reached, such as between about 100 Å and about 500 Å. Suitable process time may be controlled between about 10 seconds and about 30 seconds.

The buffer layer 404 may be controlled to have a refractive index (RI) between about 1.45 and about 1.75. The stress level of the buffer layer 404 may be controlled at a compressive film range between about −300 MPa and about a tensile range of +100 MPa. In the embodiment wherein the buffer layer 404 includes multiple layers, the SiON layer included in the buffer layer 404 may have a refractive index (RI) between about 1.52 and about 1.78, and the silicon nitride layer (SiN) included in the buffer layer 404 may have a refractive index (RI) between about 1.8 and about 1.94.

In another embodiment wherein a surface treatment process is utilized at step 304 to improve interface adhesion, the surface treatment process plasma treats the first planarization material 402 disposed on the substrate 102 to alter the substrate surface properties. Similar to the description above for depositing a buffer layer on the first planarization material 402, the plasma surface treatment process may efficiently incorporate certain elements to react with the unsaturated bonds in the first planarization material 402 so as to improve the bonding energy at the interface with the encapsulating barrier layer 406 subsequently formed thereon. The surface treatment process may assist removing contaminants from the surface of the first planarization material 402, thereby providing a good contact interface between the first planarization material 402 and the encapsulating barrier layer 406 subsequently formed thereon. Furthermore, the treatment process may also be performed to modify the morphology and/or surface roughness of the surface of the first planarization material 402 to improve the adhesion of the sequentially deposit the encapsulating barrier layer 406. In one embodiment, the surface treatment process may create a roughened surface having a surface roughness between about 6 Å and about 60 Å.

In one embodiment, the surface treatment process may be performed by supplying a gas mixture including a nitrogen containing gas into the processing chamber. The nitrogen containing gas may be selected from the group consisting of $N_2O$, $NO_2$, $NH_3$, $N_2$, combinations thereof and the like. In one exemplary embodiment, the nitrogen containing gas used to perform the substrate treatment process includes a combination of $N_2$ and $NH_3$ gas. Alternatively, a hydrogen containing gas may also supply in the gas mixture with or without the nitrogen containing gas as needed. Suitable examples of the hydrogen containing gas include $H_2$ and $NH_3$ gas. Furthermore, in certain embodiment, an inert gas may be used to perform the surface treatment process. The inert gas may not only assist removing containment from the surface of the first planarization material 402, but also assist the surface properties of the first planarization material 402 as needed. Examples of the inert gas include Ar, He or the like. It is noted that the process parameters used to perform the surface treatment process by using the nitrogen containing gas may be configured to be similar with the process parameters for using the inert gas.

During plasma surface treatment process. The substrate temperature is controlled less than about 100 degrees Celsius, such as between about 40 degrees Celsius and about 90 degrees Celsius, for example between about 60 degrees Celsius and about 90 degrees Celsius, like about 80 degrees Celsius. The lower temperature surface treatment process may prevent the organic materials disposed in or on the substrate 102 from being destroyed or damaged. The $N_2$ gas and $NH_3$ gas supplied in the gas mixture may be controlled at a flow ratio from about 10:1 to about 1:1, such as between about 5:1 and about 2:1, for example between about 3:1 to about 4:1.

Several process parameters may be controlled while performing the surface plasma treatment process. The gas flow for supplying the nitrogen containing gas is between about 0 sccm/L and about 55 sccm/L, such as between about 4 sccm/L and about 44 sccm/L, for example about 9 sccm/L and about 28 sccm/L. In the embodiment wherein $N_2$ gas and the $NH_3$ gas mixture is used to perform the surface treatment process, the $N_2$ gas and $NH_3$ gas supplied in the gas mixture may be controlled at a flow ratio from about about 10:1 to about 1:1, such as between about 5:1 and about 2:1, for example between about 3:1 to about 4:1. The RF power supplied to perform the treatment process may be controlled at between about 0 milliWatts/cm$^2$ and about 1500 milliWatts/cm$^2$, such as about 200 milliWatts/cm$^2$ and about 700 milliWatts/cm$^2$, such as about 500 milliWatts/cm$^2$ for surface treatment process. The spacing may be controlled between about 800 mils and about 1000 mils. The process pressure may be controlled at between about 0.8 Torr and about 2 Torr. The process time may be controlled at a range between about 15 seconds and about 30 seconds.

At step 306, after the buffer layer deposition or surface treatment process, an encapsulating barrier layer deposition process is performed to form the encapsulating barrier layer 406 on the buffer layer 404 or the treated first planarization material 402, as shown in FIG. 4C. In one embodiment, the encapsulating barrier layer 406 selected to deposit on the substrate 102 is a silicon nitride layer. In one embodiment, the encapsulating barrier layer 406 is a silicon nitride ($Si_3N_4$) layer or silicon nitride hydride (SixNy:H) layer formed. The silicon nitride layer may serve as a passivation layer that protects the OLED device structure formed in the substrate 102 from moisture exposure. It is noted that the buffer layer deposition or the substrate treatment process along with the encapsulating barrier layer deposition process may be performed in the same processing chamber as needed.

During deposition process at step 306, a gas mixture including at least a nitrogen containing gas and a silicon containing gas is supplied into the processing chamber to form the encapsulating barrier layer 406. Suitable examples of the silicon containing layer include $SiH_4$, $Si_2H_6$, and the like. Suitable examples of the nitrogen containing layer include $NH_3$, $N_2$, $N_2O$, $NO_2$, combinations thereof or the like. In one embodiment, the gas mixture may be supplied to form the silicon nitride layer includes $SiH_4$ and $NH_3$ and/or $N_2$. The nitrogen containing gas along with the silicon based gas are plasma dissociated in the processing chamber, forming the encapsulating barrier layer 406 of the silicon nitride ($Si_3N_4$) layer or silicon nitride hydride (SixNy:H) layer with a desired film thickness. In one embodiment, the encapsulating barrier layer 406 has a film thickness between about 3000 Å and about 5000 Å.

Several process parameters may be regulated at step 306 while forming the encapsulating barrier layer 406. In one embodiment, the processing pressure may be regulated between about 0.4 Torr and about 3 Torr, for example, between about 0.5 Torr and about 1.5 Torr. The substrate temperature is maintained at less than about 100 degrees Celsius, such as between about 40 degrees Celsius and about 90 degrees Celsius, for example between about 60 degrees Celsius and about 90 degrees Celsius, like about 80 degrees Celsius. The spacing may be controlled between about 500 mils and about 1400 mils. The gas flow of nitrogen containing gas, such as $NH_3$, $NO_2$ or $N_2$, is provided to the chamber at a flow rate between about 4 sccm to about 110 sccm, for example, about 5 sccm to about 55 sccm. The silicon based gas, such as saline ($SiH_4$) gas, is provided to the chamber at a flow rate between about 1 sccm to about 22 sccm, for example, about 3 sccm to about 12 sccm. An inert gas may be optionally supplied in the gas mixture. The gas flow of inert gas, such as Ar or He, is flowed into the chamber at a rate between about 2 sccm to about 22 sccm. The lower temperature surface treatment process may prevent the organic materials disposed in or on the substrate 102 from being destroyed or damaged. The RF power supplied to perform the treatment process may be controlled at between about 0 milliWatts/cm$^2$ and about 1500 milliWatts/cm$^2$, such as about 200 milliWatts/cm$^2$ and about 700 milliWatts/cm$^2$, such as about 500 milliWatts/cm$^2$ for surface treatment process. The spacing may be controlled between about 800 mils and about 1000 mils. The process pressure may be controlled at between about 0.8 Torr and about 2 Torr. The process time may be controlled at a range between about 15 seconds and about 30 seconds.

Figure 4D:
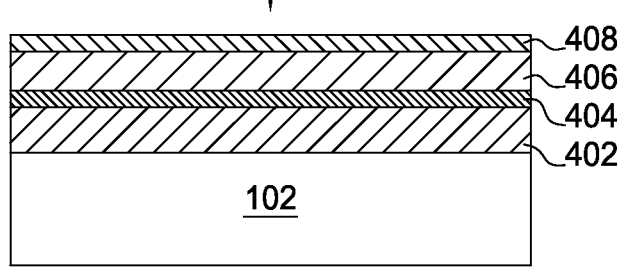

At step 308, after the encapsulating barrier layer 406 is formed on the substrate, a deposition process or a surface treatment process may be performed again to form a second buffer layer 408 or a treated surface layer 408, as shown in FIG. 4D, on the substrate 102. The deposition process or the surface treatment process may be similar to the process performed at step 304. As discussed above, in order to improve the interface adhesion where another planarization material and/or another encapsulating barrier layer 410 (as shown in FIG. 4E) may be disposed on, a deposition process or a surface treatment process may be performed to alter the surface properties to enhance interface adhesion.

As discussed above, the deposition process at step 308 may deposit a SiON, SiO$_2$ layer or a multiple film stack including a SiN layer sandwiched between SiON layers on the encapsulating barrier layer 406 and the treatment process may utilize a N$_2$/NH$_3$ gas mixture, similar to the process performed at step 304, on the encapsulating barrier layer 406. In the embodiment wherein the deposition process is performed, the second buffer layer 408 as deposited on the encapsulating barrier layer 406 may bond with the nitrogen elements formed in the encapsulating barrier layer 406 so as to enhance the interface adhesion. In the embodiment wherein the surface treatment process is performed, the N$_2$/NH$_3$ gas mixture supplied during the treatment process may incorporate nitrogen at the interface, assisting bridging with the silicon and/or oxygen elements subsequently formed thereon in the later deposited planarization material and/or encapsulating barrier layer 410.

Figure 4E:
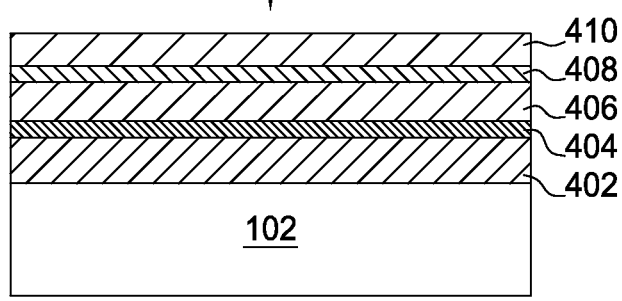

At step 310, after the deposition process or the surface treatment process, an additional planarization material and/or encapsulating barrier layer 410 may be deposited on the substrate 102 with improved surface adhesion, as shown in FIG. 4E. It is noted that the deposition process or the surface treatment process may be repeatedly performed, as shown in loop 312, at any film layer interfaces needed to complete the OLED device structure, until desired numbers of the film layers are formed.

It is noted that when a substrate is provided having the first planarization material 402 disposed thereon, a deposition process may be selected to perform on the first planarization material 402 to form the buffer layer 404 to help bridging the subsequent encapsulating barrier layer 406 to be performed thereon. As discussed above, the buffer layer 404 may be a SiON layer, SiO$_2$ layer, or a multiple film stack including a silicon nitride layer (SiN) sandwiched between SiON layers.

In the embodiment wherein a substrate is provided having a barrier layer, such as the encapsulating barrier layer 406 disposed thereon, a surface treatment process may be performed to help bridging the film layers with different film properties to be formed thereon. It is noted that both deposition process and the surface treatment process are good selection to alter surface properties whether the substrate includes different materials.

In the embodiments where only one interface with different materials requires surface adhesion enhancement, the process 300 may only be performed from step 302 to step 306.

Figure 6:
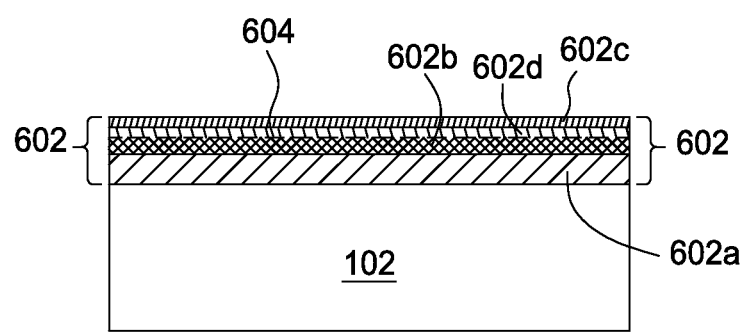
FIG. 6 depicts still another embodiment of an film structure formed on a substrate in accordance with another embodiment of the present invention.

It is noted that the deposition process or the surface treatment process may be performed at any interfaces as needed, to improve interface adhesion. In some embodiments, the deposition process may be directly performed on the surface of the substrate 102 to form a buffer layer 602 directly on the substrate 102, as further depicted in FIG. 6. As discussed above, the substrate 102 may include the OLED device structure 100 formed thereon. The buffer layer 602 may have multiple film stack, similar to the structure of the multiple film stack 404a, 404b, 404c depicted in FIG. 5, having a first layer 602a of SiON layer, a second layer 602b of SiN layer and a third layer 602c of SiON layer on the second layer 602b. In some embodiments, the buffer layer 602 may includes an additional layer 602d of silicon oxide layer, as shown by the dotted line 604, disposed on the second layer 602b of SiN layer as needed.

In one particular embodiment, a deposition process is performed to form a SiON buffer layer on a planarization material. After the SiON buffer layer is formed, an encapsulating barrier layer is formed on the SiON buffer layer. The encapsulating barrier layer may be a SiN layer. Alternatively, the encapsulating barrier layer may be a film stack having a silicon carbide layer, or a silicon oxynitride layer formed between two silicon nitride layers. The silicon caride layer may have a thickness between about 300 nm and about 500 nm and the silicon nitride layer sandwiching thereof may have a thickness between about 300 nm and about 500 nm. It is noted that the different materials with different film properties may both in form of multiple film stack as needed.

After the interface adhesion enhancement process 300 was performed, the substrate 102 exposed to a humidity test having 85% relative humidity at 85 degrees Celsius for about 100 hours up to 500 hours. The test results indicate that after performing the interface adhesion enhancement process 300 at the interface with different materials, no peeling, bubbles, or film cracks were found at the interface, demonstrating improved interface adhesion with little or no defects.

Thus, methods for performing a deposition process or a surface treatment process on an interface with different materials are provided. The deposition process deposits a buffer layer at the interface that efficiently improves interface bonding energy, so that the interface adhesion is then enhanced. The surface treatment process as performed may assist incorporating desired elements to a desired depth of a material layer, thereby efficiently improving film adhesion with good bonding energy and substantially eliminating likelihood of peeling or particle generation.

While the foregoing is directed to embodiments of the present invention, other and further embodiments of the invention may be devised without departing from the basic scope thereof, and the scope thereof is determined by the claims that follow.

What is claimed is:

1. A method of forming a buffer layer on a surface of a substrate, comprising:
   providing a substrate having a planarization material disposed on an OLED device formed on the substrate in a processing chamber, wherein the planarization material is a polymer material substantially encapsulating entire structures of the OLED device;
   supplying a buffer layer gas mixture including a silicon containing gas into the processing chamber;
   controlling a substrate temperature less than about 100 degrees Celsius;
   forming a buffer layer on the planarization material to encapsulate the OLED device, wherein the buffer layer is an inorganic material;
   supplying an encapsulating barrier layer deposition gas mixture including a silicon containing gas and a nitrogen containing gas into the processing chamber; and
   forming an encapsulating barrier layer on the buffer layer encapsulating the OLED device.

2. The method of claim 1, wherein the planarization material is selected from a group consisting of polyacrylate, parylene, polyacrylate, parylene, polyimides, polytetrafluoroethylene, copolymer of fluorinated ethylene propylene, perfluoroalkoxy copolymer resin, copolymer of ethylene and tetrafluoroethylene, parylene, plasma-polymerized hexamethyldisiloxane (pp-HMDSO), hexamethyldisiloxane (HMDSO), fluorine doped hexamethyldisiloxane (HMDSO:F), or silicon/carbon containing SiO composite.

3. The method of claim 1, wherein the buffer layer gas mixture further includes a nitrogen containing gas.

4. The method of claim 3, wherein the nitrogen containing gas is selected from a group consisting of $NH_3$, $N_2$, $N_2O$, $NO_2$ and combinations thereof.

5. The method of claim 1, wherein the silicon containing gas in the buffer layer gas mixture is $SiH_4$ and the buffer gas mixture further includes $NH_3$, $N_2$, and $N_2O$.

6. The method of claim 1, wherein the buffer layer is a SiON layer.

7. The method of claim 1, wherein the buffer layer has a refractive index between about 1.45 and about 1.75.

8. The method of claim 1, wherein the encapsulating barrier layer is a SiN layer.

9. The method of claim 1, wherein the buffer layer gas mixture further comprise:
   (a) supplying a first gas mixture to form a silicon oxynitride layer; and
   (b) supplying a second gas mixture to form a silicon nitride layer on the silicon oxynitride layer.

10. The method of claim 9, further comprising:
    repeatedly performing step (a)-(b) until a desired thickness of the buffer layer is reached.

11. The method of claim 9, wherein the buffer layer includes multiple layers having a silicon nitride layer sandwiched between silicon oxynitride layers.

12. The method of claim 9, wherein the first gas mixture includes $SiH_4$, $H_2$, and $N_2O$.

13. A method of performing a surface treatment process, comprising:
    providing a substrate having a planarization material formed on and encapsulating substantially entire structures of an OLED device disposed on the substrate in a processing chamber, wherein the planarization material is a polymer material;
    supplying a gas mixture including a nitrogen containing gas into the processing chamber; and
    performing a surface treatment process using the gas mixture on the surface of the planarization material to encapsulate the OLED device.

14. The method of claim 13, wherein performing the surface treatment process further includes:
    forming a plasma from the gas mixture to treat the surface of the planarization material.

15. The method of claim 13, wherein performing the surface treatment process further includes:
    incorporating nitrogen elements from the gas mixture into the surface of the planarization material.

16. The method of claim 15, wherein the nitrogen elements is incorporated into a depth over 500 Å the surface of the planarization material.

17. The method of claim 13, wherein the nitrogen containing gas is selected from a group consisting of $N_2O$, $NO_2$, $NH_3$, $N_2$, and combinations thereof.

18. The method of claim 13, wherein performing the surface treatment process further comprising:
    controlling the substrate at a temperature less than about 100 degrees Celsius.

19. The method of claim 13, wherein the planarization material layer is selected from a group consisting of polyacrylate, parylene, plasma-polymerized hexamethyldisiloxane (pp-HMDSO), hexamethyldisiloxane (HMDSO), fluorine doped hexamethyldisiloxane (HMDSO:F), or silicon/carbon containing SiO composite.

20. The method of claim 13, further comprising:
    forming an encapsulating barrier layer on the treated planarization material to encapsulate the OLED device, wherein the encapsulating barrier layer is a silicon nitride layer.

21. The method of claim 13, wherein the gas mixture includes $NH_3$ and $N_2$.

22. A method of performing a surface treatment process, comprising:
    providing a substrate having an encapsulating barrier layer disposed on an OLED device disposed on the substrate to encapsulate substantially entire structures of the OLED device in a processing chamber;
    supplying a gas mixture including $NH_3$ gas and $N_2$ gas into the processing chamber;
    performing a surface treatment process using the gas mixture on the surface of the encapsulating barrier layer; and
    forming a planarization material on the treated encapsulating barrier layer, wherein the planarization material is a polymer material.

* * * * *

UNITED STATES PATENT AND TRADEMARK OFFICE
CERTIFICATE OF CORRECTION

PATENT NO. : 9,449,809 B2  
APPLICATION NO. : 13/947032  
DATED : September 20, 2016  
INVENTOR(S) : Young Jin Choi et al.

Page 1 of 1

It is certified that error appears in the above-identified patent and that said Letters Patent is hereby corrected as shown below:

Specification

In column 9, line 51, delete "about about" and insert -- about --, therefor.

In column 12, line 8, delete "caride" and insert -- carbide --, therefor.

Claims

In column 12, line 61, in claim 2, after "parylene," delete "polyacrylate, parylene,".

In column 14, line 6, in claim 16, before "the" insert -- from --.

Signed and Sealed this  
Thirteenth Day of December, 2016

Michelle K. Lee  
*Director of the United States Patent and Trademark Office*